(12) United States Patent
Schumacher et al.

(10) Patent No.: US 6,927,627 B2
(45) Date of Patent: Aug. 9, 2005

(54) AMPLIFIER POWER CONTROL IN FREQUENCY HOPPING APPLICATIONS AND METHODS

(75) Inventors: Lawrence R. Schumacher, Hoffman Estates, IL (US); Vimalkaushik Natarajan, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 151 days.

(21) Appl. No.: 10/667,794

(22) Filed: Sep. 22, 2003

(65) Prior Publication Data

US 2005/0064827 A1 Mar. 24, 2005

(51) Int. Cl.$^7$ ................................................ H03G 3/20
(52) U.S. Cl. ...................................... 330/129; 330/136
(58) Field of Search .............................. 330/129, 136, 330/144; 455/110, 121, 123

(56) References Cited

U.S. PATENT DOCUMENTS

| | | | | |
|---|---|---|---|---|
| 6,438,360 B1 | * | 8/2002 | Alberth et al. | 455/110 |
| 6,556,814 B1 | * | 4/2003 | Klomsdorf et al. | 455/121 |
| 6,744,313 B2 | * | 6/2004 | Genest | 330/129 |

* cited by examiner

Primary Examiner—Henry Choe
(74) Attorney, Agent, or Firm—Roland K. Bowler, II

(57) ABSTRACT

A method in an amplifier, for example, a power amplifier in a wireless transmitter, including monitoring (310) a characteristic of the amplifier during a first active interval of the first set of active intervals, storing (320) the amplifier characteristic monitored during the first active interval of the first set of active intervals, correcting (340) an open-loop control signal to the amplifier based on the stored amplifier characteristic monitored during the first active interval of the first set of active intervals, and providing (350) the corrected control signal during a second active interval of the set of first active intervals subsequent to the first active interval of the set of first active intervals.

21 Claims, 2 Drawing Sheets

AMPLIFIER POWER CONTROL IN FREQUENCY HOPPING APPLICATIONS AND METHODS

FIELD OF THE DISCLOSURE

The present disclosure relates generally to amplifiers, and more particularly to compensating for frequency dependent changes in load impedance at an output of the amplifier, for example, in transmitter power amplifiers suitable for use in frequency hopping applications in wireless communications devices, and methods.

BACKGROUND OF THE DISCLOSURE

Open-loop amplifier control architectures, for example, in wireless communications transmitters, is desirable because they have reduced cost and complexity compared to closed-loop control architectures, which often include a coupler and power detector at the amplifier output. Open-loop amplifiers are generally less complex than closed-loop systems. In open-loop amplifier architectures, there is no feedback to the amplifier control signal during operation of the amplifier. Open-loop amplifiers also permit elimination of the commonly used coupler and detector, which add cost and consume power.

In some applications, for example, in wireless communications device transmitters, the load on the output of the amplifier can vary under certain operating conditions, and generally changes with the frequency of the amplifier signal, (i.e., the operating channel) for example, a carrier signal on which information is modulated. Particularly, the load on the amplifier output has characteristic impedance, which is generally frequency dependent. The changing load or impedance will also generally have some effect on the performance of the amplifier, for example, on the output power of a wireless communications transmitter. In many applications, the frequency of the amplified signal changes, for example, in frequency hopping modes of operation typical of some time division multiplexing (TDM) based communications protocols where signals having different frequencies are amplified during corresponding transmission bursts.

The various aspects, features and advantages of the disclosure will become more fully apparent to those having ordinary skill in the art upon careful consideration of the following Detailed Description thereof with the accompanying drawings described below.

DETAILED DESCRIPTION

Figure 1:
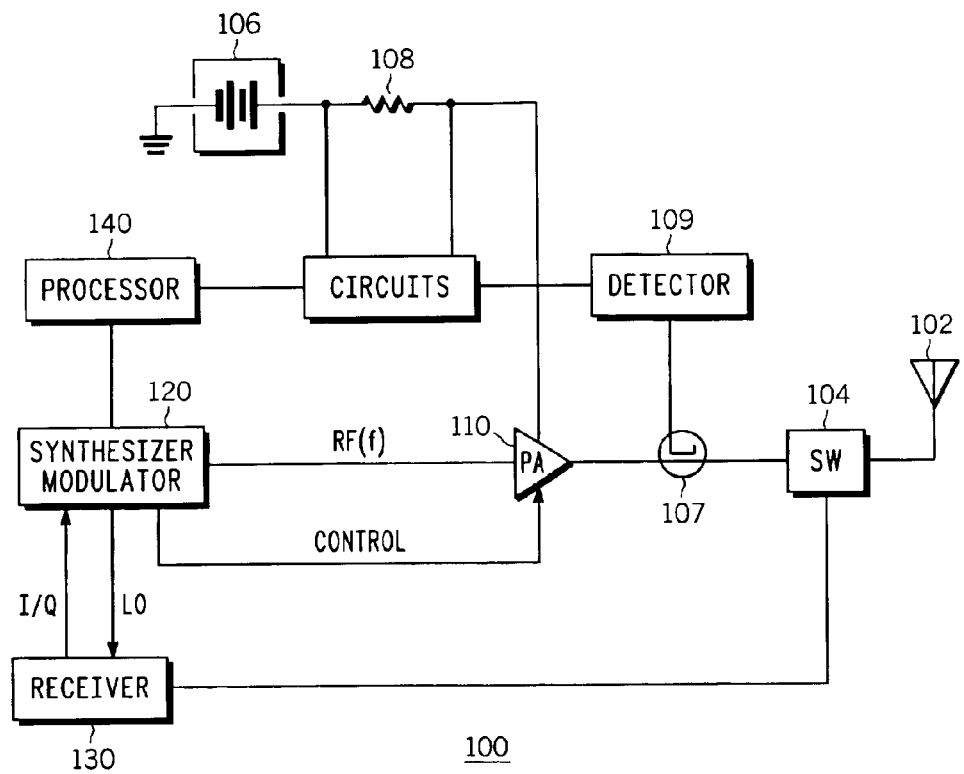
FIG. 1 is an exemplary transceiver including an amplifier.

FIG. 1 illustrates an exemplary wireless transceiver 100, for example, in a wireless communications device application. In other embodiments, the amplifier may be in some other application, for example, in a transmitter only device or in some other application that requires amplification. The transceiver 100 includes a power amplifier 110 having a signal input coupled to a signal output of a synthesizer/modulator 120. In some embodiments, the amplifier 110 and synthesizer/modulator 120 constitute an integrated device, although in other embodiments they are discrete elements. The amplifier 110 also includes a control input coupled to a control output of the synthesizer/modulator 120. In the exemplary wireless transceiver application, the processor provides signals to the synthesizer/modulator 120 for modulation on a carrier signal, for example, pursuant to a wireless communications protocol.

In the exemplary transceiver application, an output of the amplifier is coupled to an antenna 102. The antenna and more generally the load to which the amplifier output is coupled is frequency dependent. In the exemplary transmitter application, the load impedance, including the magnitude and/or phase thereof, at the amplifier output changes with any detuning of the antenna. The load impedance changes, for example, in dependence on the frequency of the signal RF(f) amplified by the amplifier.

The exemplary transceiver also includes a receiver 130 having an input coupled to the antenna 102. In the exemplary transceiver 110, a switch 104 selectively interconnects the amplifier output and the receiver input to the antenna. The receiver 130 is also includes an input coupled to a local oscillator (LO) output of the synthesizer/modulator 120. The receiver 130 also includes an output with I/Q signal components coupled to an input of the synthesizer/modulator 120. The synthesizer/modulator 120 is coupled also to a controller or processor 140. In the exemplary wireless communications device application, the processor includes audio and video signal outputs, which are provided to corresponding devices not illustrated but known by those in the art.

Figure 2:
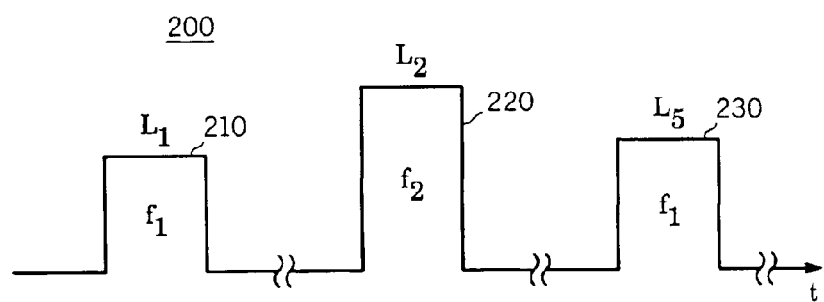
FIG. 2 is an exemplary burst output of an amplifier.

In the exemplary transceiver application of FIG. 1, the amplifier is activated by control signals from the synthesizer/modulator 120 to operate in a burst mode during which information is transmitted from or by the transceiver 100. FIG. 2 illustrates multiple amplifier output bursts, wherein each burst is driven by a corresponding control signal that dictates characteristics of the bursts, for example, burst amplitude, shape, duration, etc. In the signal diagram 200 of FIG. 2, the vertical axis is a measure of the burst, for example, the magnitude of the burst power, or burst current or burst voltage, and the horizontal axis is time.

Generally, the amplifier operates on or amplifies signals having a characteristic frequency. In some embodiments, the transmitter operates in a frequency-hopping mode, wherein the each burst has a characteristic frequency or range of frequencies determined, for example, by the frequency of the signal on which information is modulated. In FIG. 2, for example, a first burst 210 has first characteristic frequency $f_1$, a second burst 220 has a second characteristic frequency $f_2$. The fifth burst 230 has the first characteristic frequency $f_1$. Thus generally the frequency characteristic of the burst or of the signal amplified by the burst changes from burst to burst, although in some applications the bursts have the same frequency characteristic.

In one embodiment, the synthesizer/modulator 120 provides an open-loop control signal to the amplifier 110. The nature of an open-loop control signal is that the control signal is not modified by feedback when the amplifier is active, for example, during the burst interval. In other embodiments, however, the control signal is of the closed-loop type, which is modified dynamically by feedback during the active operation of the amplifier.

In one embodiment, the amplifier operates on a signal at first frequency during a corresponding set of first active intervals of the amplifier. In one embodiment, the set of active intervals is a set of bursts, for example, bursts 210, 230, etc, having the same characteristic frequency $f_1$ illustrated in FIG. 2.

Figures 3, 4:
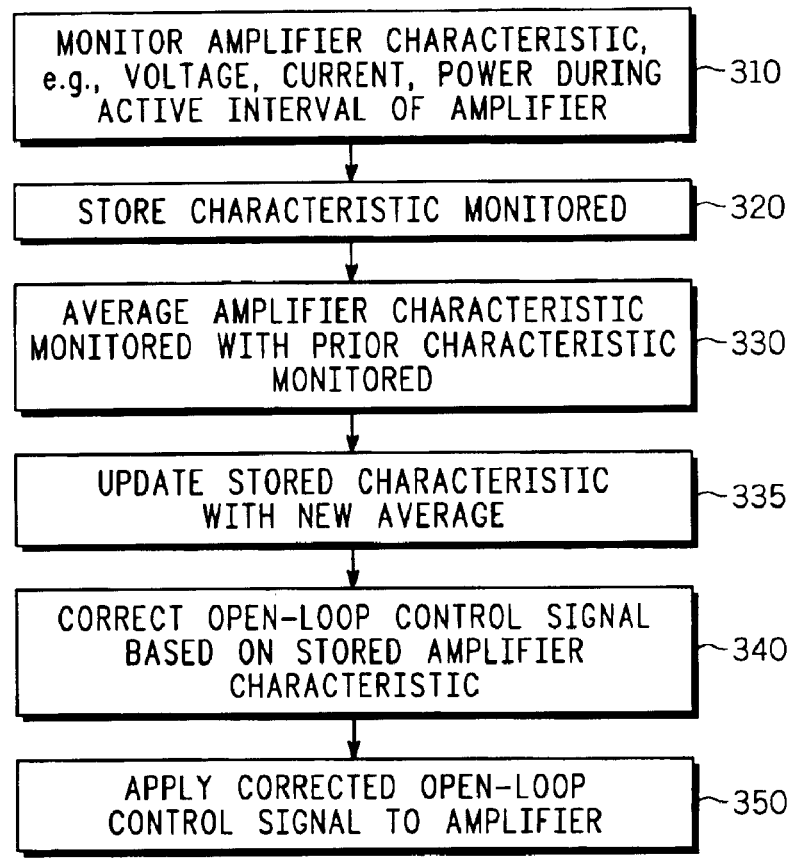
FIG. 3 is an exemplary process diagram.
FIG. 4 is an exemplary look-up table storing monitored amplifier characteristic information in association with corresponding frequency information.

In the process diagram 300 of FIG. 3, at block 310, a characteristic of the amplifier is monitored during a first active interval of the first set of active intervals. Monitoring a characteristic of the amplifier includes, for example, detecting at least one of an output power of the amplifier, a supply current of the amplifier, and a supply voltage of the amplifier. In some embodiments, the characteristic monitored is one that is dependent on the characteristic frequency associated with the burst and/or dependent on a changing load o the amplifier, for example a frequency dependent load.

In FIG. 1, the processor 140 monitors a supply voltage source 106 coupled to the amplifier. Alternatively, the processor monitors a supply current to the amplifier by detecting a voltage across a small resistor 108 in the current path. In other embodiments, the condition monitored is an output power of the amplifier. Monitoring power requires a coupler 107 at the amplifier output and detector 109. The coupler and detector generally add cost to the system, dissipate output power and introduce non-linearity to the measured output, one or more which may not be preferred for some applications. The coupler and detector are optional. In any event, it is necessary to monitor only one of these or some other characteristic of the amplifier.

In FIG. 2, the amplifier characteristic is monitored in burst 210. More generally, the characteristic is monitored during multiple active intervals, for example, during corresponding bursts, and averaged over time. In FIG. 2, for example, the characteristic is monitored during all burst, i.e., bursts 210, 230, etc., having the first characteristic frequency $f_1$.

In FIG. 3, at block 320, the amplifier characteristic monitored during active intervals is stored in memory, for example, in a look-up table. In FIG. 2, for example, the characteristic monitored ($L_1$) in connection with the first burst 210 is stored in a look-up table in association with the first frequency ($f_1$). The next characteristic monitored ($L_2$) in connection with the second burst 220 is stored in a look-up table in association with the second frequency ($f_2$). In embodiments where the frequency does not vary from burst to burst, it may be unnecessary to store frequency information. FIG. 4 illustrates an exemplary look-up table wherein the amplifier characteristic is associated with frequency.

In some embodiments, multiple amplifier characteristics monitored during corresponding active intervals of the amplifier are averaged over time. The average is preferably based on the same characteristic, for example, voltage, made during multiple bursts. In one embodiment, for example, a running average is calculated by updating a previously stored value or average with a most recently monitored characteristic. In FIG. 3, at block 335, the stored characteristic or average is updated with the new average.

In FIG. 2, for example, the characteristic monitored ($L_1$) in connection with the first burst 210 is stored in the look-up table in association with the first frequency ($f_1$). Later, the characteristic associated with the next burst associated with the first frequency ($f_1$), for example, the fifth burst ($L_5$) in FIG. 2, is averaged with the characteristic monitored ($L_1$) in connection with the first burst 210. The characteristic monitored during future bursts associated with the first frequency may also be averaged with the characteristics monitored previously.

In other embodiments, the characteristic monitored in connection with multiple frequencies in a range of frequencies are averaged and stored. In FIG. 2, for example, the characteristic monitored in during the first burst 210 associated with frequency $f_1$ and the characteristic monitored in during the second burst 220 associated with frequency $f_2$ are averaged and stored. In the look-up table of FIG. 4, the characteristic monitored $C_1$ is an average of the characteristics monitored during bursts associated with frequencies $f_1$ and $f_2$, for example characteristics $L_1$ and $L_2$ in FIG. 2. In FIG. 4, the characteristic monitored $C_2$ is an average of the characteristics monitored during bursts associated with frequencies $f_3$ and $f_4$, etc.

In one embodiment, an open-loop control signal provided to the amplifier during an active interval of a set of active intervals is provided based on the stored amplifier characteristic monitored during a prior active interval of the same set of active intervals. As suggested above, the set of active intervals may be amplifier bursts amplifying a signal having a particular frequency or range of frequencies. In FIG. 4, for example, the open loop-control signal applied to the amplifier for amplifying a signal within the frequency range $f_1$–$f_2$ is selected based on the characteristic $C_1$, the open loop-control signal applied to the amplifier for amplifying a signal within the frequency range $f_3$–$f_4$ is selected based on the characteristic $C_2$, etc.

In one embodiment, the open-loop control signal to be applied to the amplifier for operation on a signal having a particular frequency may be corrected based on previously stored characteristic information obtained from one or more bursts amplifying signals having the same frequency or the same range of frequencies, as illustrated in FIG. 3 at block 340. In some embodiments, the open-loop control signal provided to the amplifier during subsequent bursts is selected or corrected based on comparing the stored amplifier characteristic obtained during previous bursts with a reference characteristic, for example, a control signal correction may be made based on a difference between the reference characteristic and stored characteristic. The reference characteristic may be obtained based upon empirical data, which may be specific to a particular amplifier architecture and application.

In some applications, if the look-up table is devoid of stored amplifier characteristic information associated with a particular frequency or range of frequencies, the open-loop control signal may be corrected based on stored amplifier characteristic information for a nearest neighboring frequency. In FIG. 3, at block 350, the corrected control signal is applied to the amplifier for a subsequent burst, during which the amplifier characteristic may be monitored and used to update the stored average, which is used to correct future open-loop control signals.

While the present disclosure and what the best modes of the inventions have been described in a manner establishing possession thereof by the inventors and enabling those of ordinary skill in the art to make and use the same, it will be understood and appreciated that there are many equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in an amplifier, the method comprising:
operating the amplifier on a signal at first frequency during a corresponding set of first active intervals of the amplifier;
monitoring a characteristic of the amplifier during a first active interval of the first set of active intervals;

storing the amplifier characteristic monitored during the first active interval of the first set of active intervals;

providing an open-loop control signal to the amplifier during a second active interval of the set of first active intervals subsequent to the first active interval of the set of first active intervals based on the stored amplifier characteristic monitored during the first active interval of the first set of active intervals.

2. The method of claim 1, operating the amplifier on another signal at a second frequency during a corresponding set of second active intervals of the amplifier monitoring a characteristic of the amplifier during a first active interval of the second set of active intervals;

storing the amplifier characteristic monitored during the first active interval of the second set of active intervals;

providing an open-loop control signal to the amplifier during a second active interval of the set of second active intervals subsequent to the first active interval of the set of second active intervals based on the stored amplifier characteristic monitored during the first active interval of the second set of active intervals.

3. The method of claim 2, storing the amplifier characteristics monitored during the first and second sets of active intervals in association with the corresponding first and second frequencies of the first and second signals.

4. The method of claim 1, monitoring the characteristic of the amplifier during a plurality of active intervals of the first set of active intervals, the plurality of active intervals including the first active interval;

averaging the plurality of characteristics monitored during the plurality of active intervals;

storing the average of the plurality of characteristics monitored during the plurality of active intervals;

providing the open-loop control signal to the amplifier during an active interval subsequent to the plurality of active intervals based on the stored average of the plurality of characteristics monitored during the plurality of active intervals.

5. The method of claim 1, selecting the open-loop control signal provided to the amplifier during the second active interval based on comparing the stored amplifier characteristic with a reference characteristic.

6. The method of claim 1, monitoring the characteristic of the amplifier includes detecting at least one of an output power of the amplifier, a supply current of the amplifier, and a supply voltage of the amplifier.

7. The method of claim 1, providing the open-loop control signal to the amplifier by providing a control signal that is not modified by feed back when the amplifier is active.

8. A method in an amplifier, the method comprising:

monitoring a characteristic of the amplifier during an operating interval of the amplifier;

storing the characteristic monitored;

providing an open-loop control signal to the amplifier during an operating interval subsequent to the operating interval during which the characteristic is monitored, the open-loop control signal based on the characteristic monitored.

9. The method of claim 8, selecting the open-loop control signal provided to the amplifier during the subsequent operating interval based on comparing the stored characteristic with a reference characteristic.

10. The method of claim 8, monitoring the characteristic includes:

monitoring the characteristic over multiple operating intervals of the amplifier at a common frequency, averaging the characteristic monitored at the common frequency, and storing the average of the characteristic monitored over multiple operating intervals of the amplifier at the common frequency.

11. The method of claim 8, monitoring the characteristic of the amplifier includes detecting at least one of an output power of the amplifier, a supply current of the amplifier, and a supply voltage of the amplifier.

12. The method of claim 8, providing the open-loop control signal to the amplifier includes providing to the amplifier a control signal that is not modified by feedback during operation of the amplifier.

13. An amplification method in a transmitter that transmits signals in sequential bursts produced by an amplifier in response to corresponding open-loop control signals, the method comprising:

producing a burst in response to an open-loop control signal applied to the amplifier;

monitoring a characteristic of the amplifier during a first burst;

storing the characteristic monitored;

applying a second open-loop control signal to the amplifier, subsequent to the first open-loop control signal, the second open-loop control signal based on the stored characteristic monitored during the first burst.

14. The method of claim 13, monitoring a characteristic of the amplifier during a plurality of bursts including the first burst;

averaging a plurality of characteristics monitored in connection with a particular frequency;

storing the average of the plurality of characteristics monitored in connection with the particular frequency;

applying the second open-loop control signal to the amplifier based on the stored average of the plurality of characteristics monitored.

15. The method of claim 13, monitoring a characteristic of the amplifier during a plurality of bursts including the first burst;

averaging a plurality of characteristics monitored in connection with a range of frequencies;

storing the average of the plurality of characteristics monitored in connection with the range of frequencies;

applying the second open-loop control signal to the amplifier based on the stored average of the plurality of characteristics monitored in connection with the range of frequencies.

16. The method of claim 13, selecting the second open-loop control signal, before applying the second open-loop control signal, based on a comparison of the stored characteristic with a reference characteristic.

17. The method of claim 13, monitoring the characteristic of the amplifier includes detecting at least one of an output power of the amplifier, a supply current of the amplifier, and a supply voltage of the amplifier.

18. The method of claim 13, providing the open-loop control signal to the amplifier includes providing to the amplifier a control signal that is not modified by feedback during a burst.

19. A method in an amplifier, the method comprising, operating the amplifier in burst mode in response to open loop control signals applied to the amplifier, each burst having a characteristic frequency within a first range of frequencies;

monitoring a characteristic of the amplifier at multiple frequencies within the first range of frequencies;

averaging the characteristic monitored at the multiple frequencies within the first range of frequencies;

storing the averaged characteristic in association with the first range of frequencies;

providing open-loop control signals to the amplifier for operation within the first range of frequencies based on the averaged characteristic stored in association with the first range of frequencies.

20. The method of claim 19, monitoring a characteristic of the amplifier at multiple frequencies within a second range of frequencies;

averaging the characteristic monitored at the multiple frequencies within the second range of frequencies;

storing the averaged characteristic in association with the second range of frequencies;

providing open-loop control signals to the amplifier for operation within the second range of frequencies based on the averaged characteristic stored in association with the second range of frequencies.

21. The method of claim 19, providing the open-loop control signals to the amplifier by providing to the amplifier control signals that is not modified by feedback during a burst.

* * * * *